Sept. 18, 1962

R. ETHERINGTON

CRYSTAL CONTROLLED OSCILLATOR WITH TEMPERATURE COMPENSATING MEANS 3,054,966

Filed July 15, 1959

3 Sheets-Sheet 1

INVENTOR.
RALPH ETHERINGTON
BY Isidore Match
ATTORNEY

INVENTOR.
RALPH ETHERINGTON
BY Isidore Match
ATTORNEY

*INVENTOR.*
RALPH ETHERINGTON
*BY* Isidore Match
ATTORNEY

United States Patent Office 3,054,966

Patented Sept. 18, 1962

3,054,966

CRYSTAL CONTROLLED OSCILLATOR WITH TEMPERATURE COMPENSATING MEANS

Ralph Etherington, Lynchburg, Va., assignor to General Electric Company, a corporation of New York Filed July 15, 1959, Ser. No. 827,192
12 Claims. (Cl. 331—66)

This invention relates to control apparatus. More particularly it relates to circuit means for compensating for frequency deviation in piezoelectric resonator controlled oscillator circuits in response to changes in temperature.

Piezoelectric crystals have been widely used in various types of electronic equipment for precise control of frequency of oscillation. Such crystals are advantageously used in oscillators to attain a high degree of frequency stability.

For operation of a crystal controlled oscillator where high degrees of frequency stability are not particularly required, the variation in resonant frequency with temperature of piezoelectric crystals is relatively small enough so that changes in temperature do not appreciably affect the frequency stability of output of the oscillator. However, where high degrees of stability of frequency are required in the output of a crystal controlled oscillator, then the variation of resonant frequency with temperature in the crystal substantially affects the stability of the output of the oscillator and has to be compensated for.

Heretofore, to solve the problem of crystal resonant frequency variation with temperature, there has usually been employed a controlled heating device. However, such device is cumbersome, expensive and requires an expenditure of power.

Accordingly, it is an object of this invention to provide a circuit for compensating for the variation in resonant frequency because of temperature change of a piezoelectric resonator without the need of a temperature regulating device for such resonator.

It is another object to provide a circuit in accordance with the preceding object for stabilizing the frequency of a crystal controlled transistor oscillator in an environmental temperature ranging from about −30° C. to about 70° C.

Generally speaking and in accordance with the invention, there is provided a circuit for producing a unidirectional potential which varies in response to a given range of temperature in accordance with a chosen non-linear pattern comprising a unidirectional potential source and means for automatically selectively inserting different combinations of resistances in circuit with the source in response to different temperature levels within the range. Each of the combinations of resistances respectively have different type net temperature coefficients whereby the output of the circuit varies across the temperature range in accordance with the non-linear pattern.

The features of this invention, which are believed to by new, are set forth with particularly in the appended claims. The invention itself, however, may best be understood by reference to the following description when taken in conjunction with the accompanying drawings which show embodiments of circuits according to the invention.

Figure 1:
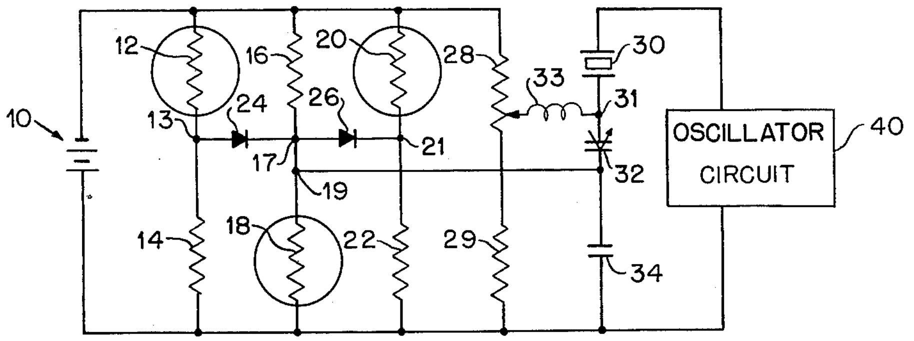
FIG. 1 is a schematic diagram of a preferred embodiment of the invention.

Referring now to FIG. 1, a source 10 of unidirectional potential, which may be a battery, is shunted by a first series arrangement of resistances 12 and 14, a second series arrangement of resistances 16 and 18 and a third series arrangement of resistances 20 and 22. Resistances 12, 18, and 20 represent respectively, a series and/or parallel combination of one or more negative temperature coefficient resistors and may include one or more zero temperature coefficient resistors. Resistances 14, 16, and 22 respectively represent similar combinations of resistors having a net zero temperature coefficient. A first diode 24 is connected between the junction point 13 of resistances 12 and 14 and the junction point 17 of resistances 16 and 18. A second diode 26 is connected between junction point 17 and the junction point 21 of resistances 20 and 22. Diodes 24 and 26 are poled as shown as will be further explained hereinbelow.

In the circuit of FIG. 1 the negative temperature coefficient resistors included in resistances 12, 18, and 20 may suitably be of the type known as thermistors which decrease in resistance as their temperature rises and increase in resistance as their temperature falls. Diodes 24 and 26 may suitably be of the semi-conductor type.

Considering the operation of the circuit of FIG. 1, it is seen that if the combination of resistors comprising resistance 12 is chosen to have a net negative temperature coefficient of suitable value and similarly, if the combination comprising resistance 18 is also chosen to have a net negative temperature coefficient value, and if the various resistances are chosen to have given values at a prescribed reference temperature, at some low temperature, the quantities of the voltage drops across resistances 12 and 14 and resistances 16 and 18 are such that junction point 13 is positive with respect to junction point 17 and diode 24 conducts. Similarly, if resistance 20 is chosen to have a net negative temperature coefficient, and resistances 20 and 22 have suitable values at the reference temeprature, junction point 17 will be quite negative with respect to junction point 21 and diode 26 will be rendered non-conductive. As the temperature rises the values of resistances 12, 18, and 20 will progressively decrease, the values of resistances 14, 16, and 22 remaining substantially constant. When the temperature rises to a point where the voltage at junction point 13 is more negative than the voltage at junction point 17, diode 24 is also rendered non-conductive. It can be seen that as long as the ratio of the values of resistance 12 to resistance 14 is greater than the ratio of the values of resistance 16 to resistance 18, diode 24 remains conductive and is rendered non-conductive just about at the point where these ratios become equal. At the time that diode 24 is rendered non-conductive, the ratio of the values of resistance 16 to resistance 18 is still less than the ratio of the values of resistance 20 to resistance 22 and diode 26 remains non-conductive. As the temperature continues to increase, junction point 13 progressively becomes more negative with respect to junction point 17 and junction point 17 simultaneously becomes less negative with respect to junction point 21. At about the point that the ratio of the value of resistance 16 to 18 equals the ratio of the value of resistance 20 to resistance 22, diode 26 is rendered conductive. Thus, it is readily appreciated that during the time that diode 24 is conductive and diode 26 is non-conductive the output voltage at point 19 is a function of the parallel combination of resistance 12 and resistance 16 and the parallel combination of resistance 14 and resistance 18. Between the temperatures that both diodes are non-conductive, the output voltage at point 19 is substantially a function of resistance 16 and resistance 18 only, and above the temperature that diode 26 is rendered conductive, the output voltage at point 19 is a function of the parallel combination of resistance 16 and resistance 20 and the parallel combination of resistance 18 and resistance 22.

In FIG. 1, the remainder of the circuit shows block 40 which represents an oscillator circuit, there being schematically shown in shunt therewith, a piezoelectric crystal 30 which controls the frequency thereof, a voltage sensitive capacitor 32 of the semi-conductor type and a capacitor 34. Shunting the series arrangement of capacitors 32 and 34 is a series arrangement comprising a potentiometer 28 and a resistor 29. A radio frequency choke is included between the tap on potentiometer 28 and the junction 31 of crystal 30 and voltage sensitive capacitor 32 to isolate the radio frequency from oscillator circuit 40. The ratio of resistance 28 to resistance 29 is chosen so as to make junction 31 always negative with respect to junction 19. The output voltage from point 19 is shown as applied to the junction of capacitors 32 and 34. Since capacitor 32 has been chosen to be a voltage sensitive capacitor, variations of voltage from point 19 applied thereto varies the capacity thereof and thus varies the frequency output of the circuit.

Figure 2:
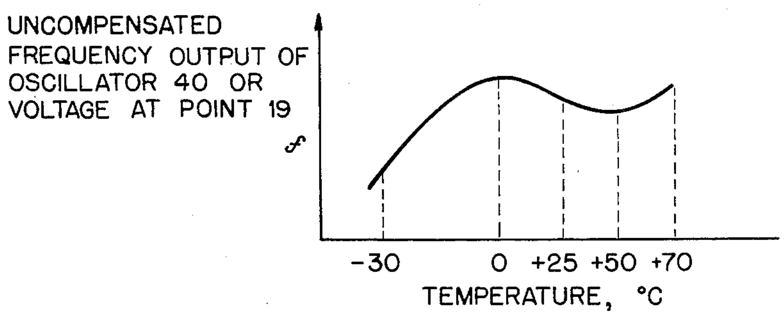
FIG. 2 is a curve which indicates the variation of the unidirectional potential output of the device of FIG. 1 in response to temperature and/or the uncompensated variation of frequency with temperature in the output of the oscillator of FIG. 1.

In FIG. 2, there is shown a graph wherein the abscissa is temeprature and wherein the ordinate is the voltage at point 19. The ordinate also substantially represents the variation in frequency in the output of oscillator 40 controlled by a piezoelectric crystal such as the AT cut type described hereinabove at the same temperatures if it were not compensated in accordance with the principles of the invention. It is now seen that by varying the voltage from point 19 during a given range of temperature in a manner substantially corresponding to the variation in the natural resonant frequency of crystal 30 which controls the output of oscillator 40, the frequency deviation of the oscillator is substantially compensated for. If the values of the resistances in the circuit are so chosen that the ratio of the values of resistance 12 to resistance 14 is approximately equal to the ratio of the values of resistance 16 to resistance 18 at 0° C., the peak of the voltage curve of FIG. 2 occurs at 0° C. Similarly, if the values of resistances 16, 18, 20, and 22 utilized in connection with such crystal are so chosen that the ratio of the values of resistance 16 to resistance 18 is approximately equal to the ratio of the values of resistance 20 to resistance 22 at 50° C., then the minimum as shown in the curve at FIG. 2 will occur at 50° C. It is, of course, to be understood that other voltage outputs paralleling the characteristic resonant frequency deviation against temperature curves of other crystals may be so derived and it is not intended to be limited to this particular example.

Figure 3:
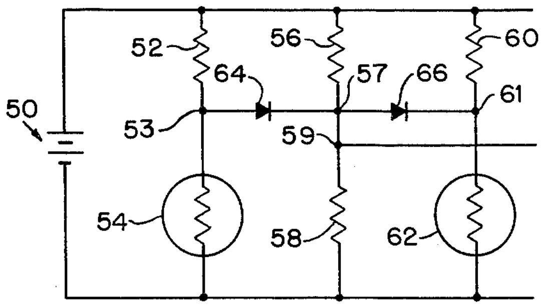
FIG. 3 is a depiction of another embodiment of the invention.

Referring now to FIG. 3, there is shown a circuit similar to that of FIG. 1 except that resistances 52, 56, 58, and 60 are resistor combinations which have a net zero temperature coefficient respectively and resistances 54 and 62 are combinations of resistors which have a net negative temperature coefficient respectively.

It is seen that in the operation of the circuit of FIG. 3, the ratio of the values of resistances 52 and 54 increases as temperature increases as does the ratio of the values of resistances 60 and 62. The ratio of the values of resistance 56 to resistance 58 remains relatively constant. Thus, with suitable selection of resistance values at very low temperatures, junction point 53 is positive with respect to junction point 57, which is in turn negative with respect to junction point 61. At this temperature, diode 64 conducts while diode 66 does not. As the ratio of the value of resistance 52 to the value of resistance 54 equals and then becomes greater than the relatively fixed ratio of the value of resistance 56 to the value of resistance 58, diode 64 is rendered non-conductive. Simultaneously, junction point 61 also decreases in potential but not sufficiently for the potential at junction point 57 to exceed the potential at junction point 61 so that diode 66 remains non-conductive. As the temperature increases to a point where the ratio of the values of resistance 60 to resistance 62 equals and then becomes greater than the ratio of the values of resistance 56 to resistance 58, diode 66 is rendered conductive, with the further results as described in the operation of the circuit of FIG. 1.

Figure 4:
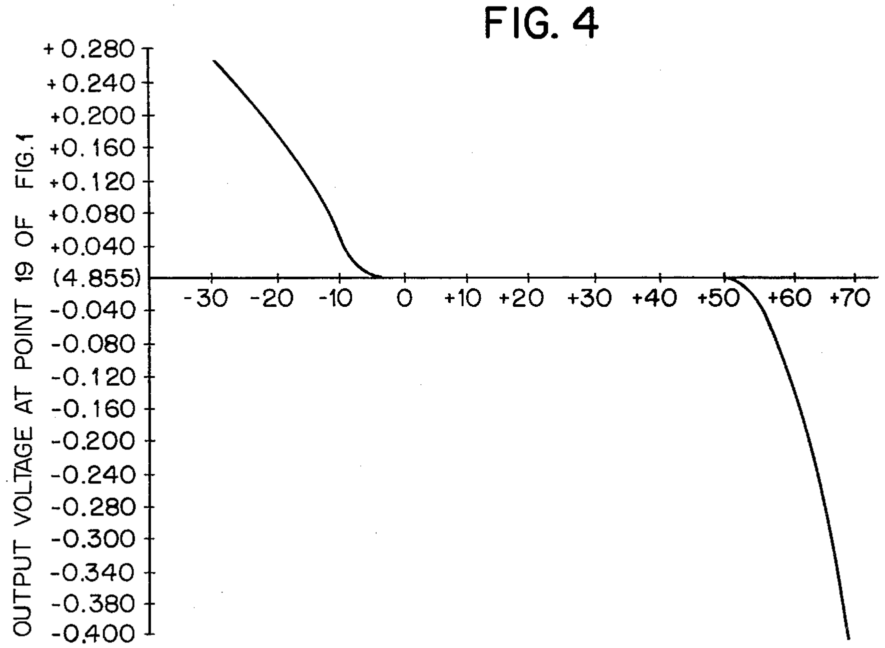
FIG. 4 is a graph which indicates the output voltage of the circuit of FIG. 3 in response to temperature changes.

In FIG. 4, there is shown a graph wherein the abscissa is temperature and the ordinate is deviation of voltage from a given voltage at point 59 in the circuit of FIG. 3. It is seen that the voltage deviation progressively decreases between the temperatures of −30° C. and 0° C., that between the temperatures of 0° C. and 50° C., the voltage deviation is substantially zero and that above 50°, the voltage deviation is substantial and in the negative direction.

While it is not intended to be limited to any particular circuit values for the embodiment of the invention described in connection with FIG. 3, the following set of representative values for the elements are believed to be suitable in this circuit; resistance 52, 2.7K ohms, resistance 56, 2K ohms, resistance 58, 6.2K ohms, and resistance 60, 1.5K ohms. Resistance 54 is a thermistor made by the General Electric Company and is the type designated GE type 763H. It has a value of 3K ohms at 25° C., and B, 3100. Resistance 62 is also a GE type 763H thermistor and has a value of 12K ohms at 25° C., B, 3560. Diodes 64 and 66 are of the semi-conductor type designated HD2151 made by the Hughes Aircraft Company. The voltage at source 50 is 6.456 volts.

Figures 5, 6:
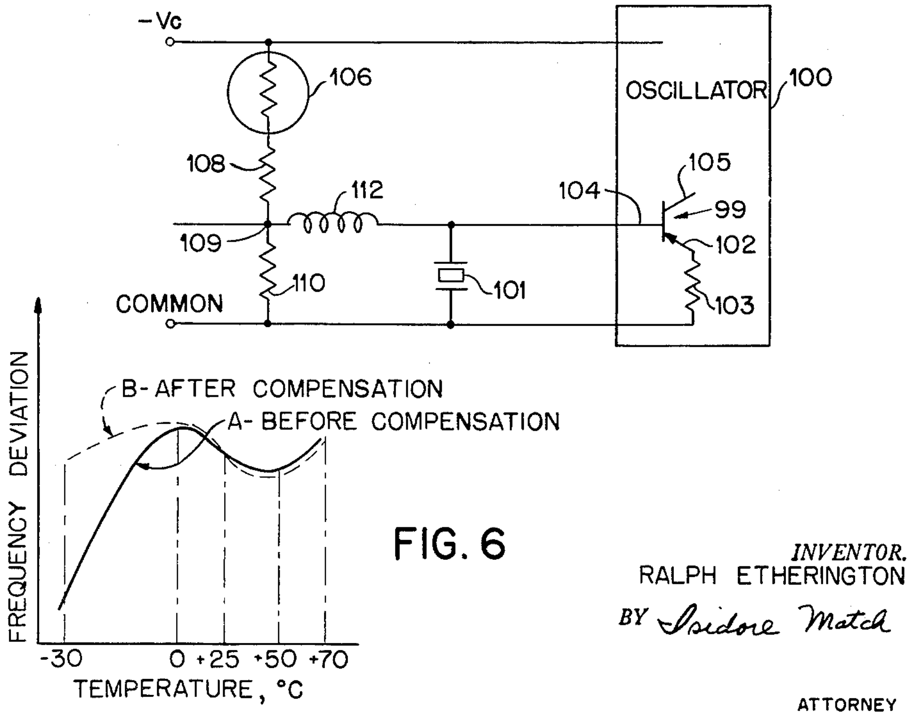
FIG. 5 is a schematic diagram of another embodiment of the invention.
FIG. 6 is a graph which shows the output frequency of the embodiment of FIG. 5 in response to temperature changes.

Referring now to FIG. 5, there is shown an arrangement in accordance with the principles of the invention for compensating for variation in the frequency characteristic of a piezoelectric crystal caused by temperature where compensation is desired at only one end of a given temperature range, i.e., the lower end of such range. In this figure, the crystal controls the frequency of the output of a transistor oscillator.

Generally speaking, a change in the bias which causes the oscillator emitter current to decrease will also cause the frequency of oscillation to increase. This is due to the dependence of the transistor input and output impedances on the emitter current. For a given change in frequency, the magnitude of the bias change desired is dependent upon the type of transistor, crystal, and associated circuitry.

In FIG. 5, the transistor oscillator 100 is shown as comprising a transistor 99 with a crystal 101 controlling the frequency thereof connected between the base electrode 104 and common. It is understood that the emitter current that flows in the transistor depends directly upon the degree that the base electrode is biased negatively with respect to the emitter electrode. The unidirectional potential source for providing biasing potentials to the transistor electrodes is depicted in FIG. 5 as comprising the two terminals designated $-V_c$ and common.

Connected between $-V_c$ and common is a voltage divider arrangement including a resistance 106 comprising a combination of resistors which has a net negative temperature coefficient, a resistance 108 which is a combination of resistors having a substantially net zero temperature coefficient, and a resistance 110 which is a combination of resistors having a substantially net zero temperature coefficient. The voltage developed across resistance 110 is applied between the base electrode 104 and common through an RFC coil, the crystal 101 being connected between base electrode 104 and common.

At the lower end of the temperature scale, since resistance 106 has a net negative temperature coefficient, the voltage at junction point 109 is at a relatively low level. The value of resistance 106, which is chosen so that it is large relative to the value of resistance 108 at low temperatures, decreases with increase in temperature to a point where the ratio of the values of the resistances is such that the change in voltage applied to base is relatively small. The emitter current is lowest at the point that the voltage at junction point 109 is at its lowest level. Conversely, as the voltage at junction point 109 increases, the emitter current increases.

In the graph of FIG. 6 wherein the abscissa is temperature range and the ordinate is frequency deviation of the output of oscillator 100, the base electrode biasing voltage would be relatively constant for all temperatures if resistance 106 were of the net zero temperature coefficient type as are resistances 108 and 110 and the frequency deviation with respect to temperature of the uncompensated oscillator would be as shown by curve A of FIG. 6. Utilizing the combination of resistances 106, 108 and 110 as shown, the frequency deviation is that shown in curve B.

Figure 7:
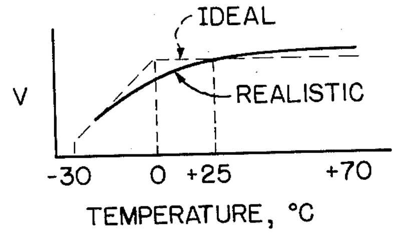
FIG. 7 is a graph which depicts the voltage appearing at 109 of the embodiment of FIG. 5 in response to temperature.

For the ideal case the compensation, as shown in the graph of FIG. 7, would maintain the base electrode bias voltage relatively constant above approximately zero degrees centigrade while it would provide a decreasing bias voltage below this temperature. Thus, based on the sensitivity of the oscillator to bias changes, the slope of the bias voltage between −30° C. and 0° C. is preferably adjusted to provide the desired compensation. Such slope may be adjusted by varying the ratio of the values of resistance 108 to resistance 106 as well as varying the net negative temperature coefficient of resistance 106. To approach the ideal voltage bias response of FIG. 7, the ratio of the value of resistance 108 to resistance 106 should be as high as possible at about 0° C. while providing the correct sum of the values of resistances 106 and 108 which is necessary at −30° C. to create the desired change in frequency.

Figure 8:
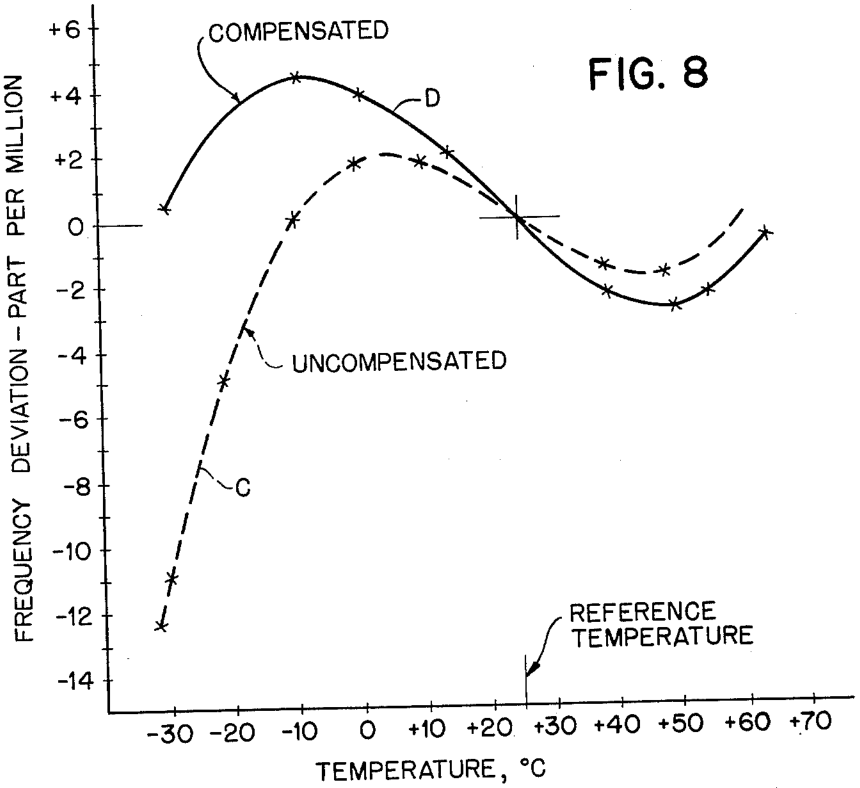
FIG. 8 is a graph which indicates the respective frequency deviations of an uncompensated transistor oscillator and a transistor oscillator as depicted in FIG. 5 and compensated in accordance with the principles of the invention.

In FIG. 8, there is shown a graph wherein the abscissa is temperature range and the ordinate is frequency deviation in parts per million obtainable with the circuit of FIG. 5. Curve C is the one resulting where no compensation is employed and curve D is the one resulting from the compensation in accordance with the invention. As an example, to obtain the values plotted in curve D of FIG. 8, the circuit components utilized and their values are as follows: resistance 106, thermistor GE type 763H, 1K ohms at 25° C.; B, 2800, resistance 108, 5.6K ohms; resistance 110, 2.2K ohms; and resistance 103, 2.2K ohms. The deviation is with respect to the output frequency of oscillator 100 at 25° C. It is seen that at this point the ordinate is substantially zero deviation.

With the above invention, it is possible to provide a crystal controlled oscillator such as a 6 mc. oscillator capable of 0.0005% frequency stability over the temperature range of −30° C. to 70° C. No temperature controlling device is necessary and the result is a simple apparatus which is highly flexible and can be applied in any circuit wherein a change in bias voltage compensates for a change in the frequency characteristic of a piezoelectric crystal caused by temperature variation. It is to be understood that although the examples depicted and described have shown PNP type transistors, other types may be utilized and the polarity of the unidirectional potential sources required for their proper operation necessarily have to be suitably chosen.

While there have been shown and described particular embodiments of this invention, it is apparent that other forms and embodiments may be made, and it is contemplated in the claims to cover any such modifications as fall within the spirit and scope of the invention.

What is claimed is:

1. A circuit for producing a unidirectional potential which varies in response to a given range of temperature in accordance with a chosen non-linear pattern comprising a source of unidirectional potential, means for automatically selectively inserting different combinations of resistances in circuit with said source in response to different temperature levels within said range, the values and net temperature coefficients of said resistances being chosen so as to provide different potential versus temperature slopes for each of said levels.

2. A circuit for producing a unidirectional voltage which varies in response to changes in temperature in accordance with a chosen non-linear pattern over a given temperature range comprising a source of unidirectional potential, a first resistance combination having a first net temperature coefficient, a second resistance combination having a second net temperature coefficient, means for automatically inserting one of said combinations into circuit with said source in response to a given temperature to derive a voltage having a first slope with respect to temperature over a first portion of said range, and for automatically replacing said first combination with said second combination in response to the temperature at a terminal temperature of said first portion to derive a second voltage having a second slope with respect to temperature over a second portion of said range.

3. A circuit for producing a unidirectional voltage which varies in response to changes in temperature in accordance with a chosen non-linear pattern over a given temperature range comprising a source of unidirectional potential, a first voltage divider comprising a plurality of resistances, a second voltage divider comprising a plurality of resistances, at least one of said resistances having a temperature coefficient other than zero and means for automatically inserting one of said dividers into circuit with said source at a given temperature to derive a first voltage having a first slope with respect to temperature over a first portion of said range and to automatically replace said one divider with the other divider at a terminal temperature of said portion to derive a second voltage having a second slope over a second portion of said range.

4. A circuit for producing a unidirectional voltage which varies in response to changes in temperature in accordance with a chosen non-linear pattern over a given range of temperatures comprising a source of unidirectional potential, a resistance of the negative coefficient type, a resistance of the positive coefficient type, a resistance of the zero temperature coefficient type, means for automatically inserting one of said types into circuit with said source in response to a given temperature to derive a first voltage having a generally first slope with respect to temperature over a first portion of said range and for replacing said first type with one of said other types in circuit with said source at a terminal temperature of said portion to derive a second voltage having a generally second slope with respect to temperature over a second succeeding portion of said range.

5. A circuit for producing a unidirectional potential which varies in response to changes in temperature over a given range of temperatures in a chosen non-linear pattern comprising a source of unidirectional potential, a first voltage divider comprising a first plurality of resistances connected across said source, a second voltage divider comprising a second plurality of resistances connected in shunt with said first divider, first unidirectional conducting means connected between respective intermediate points on said first and said second dividers, at least one of said resistances having a temperature coefficient other than zero whereby said unidirectional conducting means is rendered conductive over a first given portion of said range below a first predetermined temperature, a third voltage divider connected in shunt with said second voltage divider, second unidirectional conducting means connected between said intermediate point on said second voltage divider and an intermediate point on said third divider, at least one of the resistances comprising said second and third dividers having a temperature coefficient other than zero whereby said second unidirectional conducting means is rendered conductive over a portion of said range exceeding a second predetermined temperature, said first and second unidirectional conducting means both being non-conductive in the portion of said range between said first and second predetermined temperatures whereby a voltage derived from said second divider varies in accordance with said pattern over said range.

6. A circuit for producing a unidirectional potential which varies in response to changes in temperature over a given range of temperatures in accordance with a substantially nonlinear pattern comprising a source of unidirectional potential, a first voltage divider comprising a resistance having a negative temperature coefficient and a resistance having a substantially zero temperature coefficient connected across said source, a second voltage divider comprising a resistance having a negative temperature coefficient and a resistance having a substantially zero temperature coefficient connected in shunt with said first divider, first unidirectional conducting means connected between the respective junctions of said first and second dividers, the values of said resistances being so chosen and the first unidirectional conducting means being poled so as to render said conducting means conductive over a portion of said range below a predetermined temperature, a third voltage divider comprising a resistance having a negative temperature coefficient and a resistance having a substantially zero temperature coefficient, second unidirectional conducting means connected between the junctions of the resistances comprising said second and third voltage dividers respectively, the values of the resistances of said second and third dividers being chosen and said second conducting means being poled so as to render said second conducting means conductive over a portion of said range above a second predetermined temperature, both of said conducting means being non-conductive in the portion of said range between said predetermined temperatures whereby the voltage derived from the junction in said second divider is substantially a function of the values of the resistances comprising said first and second dividers when said first conducting means is conductive, is substantially a function of the values of the resistances comprising said second divider when both of said conducting means are non-conductive and is substantially a function of the resistances comprising said second and third dividers when only said second conducting means is conductive.

7. A circuit for producing a unidirectional potential which varies in response to changes in temperature over a given range of temperatures in a substantially sigmoidal pattern comprising a source of unidirectional potential having a common and a negative terminal, a first voltage divider comprising a first resistance having a net negative temperature coefficient, one end of said first resistance being connected to said negative terminal and a second resistance having a substantially zero net temperature coefficient connected between the other end of said first resistance and said common terminal, a second voltage divider connected in shunt with said first divider, said second divider comprising a third resistance having a net negative temperature coefficient, one end of said third resistance being connected to said common terminal and a fourth resistance connected between the other end of said third resistance and said negative terminal, first unidirectional conducting means connected between a first junction of said first and second resistances and a second junction of said third and fourth resistances, said first conducting means being poled so as to be conductive when said first junction is positive with respect to said second junction, a third voltage divider comprising a fifth resistance having net negative temperature coefficient, said fifth resistance having one end connected to said negative terminal and a sixth resistance having a substantially net zero temperature coefficient connected between the other end of said fifth resistance and said common terminal, second unilateral conducting means connected between said second junction and a third junction of said fifth and sixth resistances, said second conducting means being poled so as to be conductive when said second junction is positive wtih respect to said third junction, the values of said resistances being so chosen that only said first conducting means is conductive at a lower end portion of said range, only said second conducting means is conductive over an upper end portion of said range and both of said conducting means are non-conductive over the portion of said range intermediate said lower and upper end portions whereby the potential at said second junction is a function of the resistances comprising said first and second divider when only said first conducting means is conductive, is a function of the resistances comprising said second and third dividers when only said second conducting means is conductive and is a function of the resistances comprising said second divider when both of said conducting means are non-conductive.

8. A circuit for producing a unidirectional potential which varies in response to changes in temperature over a given range of temperatures in a substantially nonlinear pattern comprising a source of unidirectional potential having a common and a negative terminal, a first voltage divider comprising a first resistance having a net negative temperature coefficient, one end of said first resistance being connected to said negative terminal and a second resistance having a substantially zero net temperature coefficient connected between the other end of said first resistance and said common terminal, a second voltage divider connected in shunt with said first divider, said second divider comprising third and fourth resistances having respectively zero net temperature coefficients, first unidirectional conducting means connected between a first junction of said first and said second resistances and a second junction of said third and fourth resistances, said first conducting means being poled so as to be conductive when said first junction is positive with respect to said second junction, a third voltage divider comprising a fifth resistance havng a net negative temperature coefficient, said fifth resistance having one end connected to said negative terminal and a sixth resistance having a substantially net zero temperature coefficient connected between the other end of said fifth resistance and said common terminal, second unilateral conducting means connected between said second junction and a third junction of said fifth and sixth resistances, said second conducting means being poled so as to be conductive when said second junction is positive with respect to said third junction, the values of said resistances being so chosen that only said first conducting means is conductive at a lower end portion of said range, only said second conducting means is conductive over an upper end portion of said range, and both of said conducting means are non-conductive over the portion of said range intermediate said lower and upper end portions whereby the potential at said second junction is a function of the resistances comprising said first and second dividers when only said first conducting means is conductive, is a function of the resistances comprising said second and third dividers when only said second conducting means is conductive, and is a function of the resistances comprising said second divider when both of said conducting means are non-conductive.

9. In a crystal controlled oscillator, means for varying the capacitance of said crystal in accordance with the change in resonant frequency of said crystal in response to temperature variations over a given range of temperatures comprising a voltage sensitive capacitance in series arrangement with said crystal and means for applying a unidirectional potential to said capacitance in accordance with said resonant frequency deviation comprising a source of unidirectional potential having a common and a negative terminal, a first voltage divider comprising a first resistance having a net negative temperature coefficient, one end of said first resistance being connected to said negative terminal and a second resistance having a substantially zero net temperature coefficient connected between the other end of said first resistance and said common terminal, a second voltage divider connected in shunt with said first divider, said second divider comprising a third resistance having a net negative temperature coefficient one end of said third resistance being connected to said common terminal and a fourth resistance connected between the other end of said third resistance and said negative terminal, first unidirectional conducting means connected between a first junction of said first and second resistances and a second junction of said third and fourth resistances, said first conducting means being poled so as to be conductive when said first junction is positive with respect to said second junction, a third voltage divider comprising a fifth resistance having a net negative temperature coefficient, said fifth resistance having one end connected to said negative terminal and a sixth resistance having a substantially net zero temperature coefficient connected between the other end of said fifth resistance and said common terminal, second unilateral conducting means connected between said second junction and a third junction of said fifth and sixth resistances, said second conducting means being poled so as to be conductive when said second junction is positive with respect to said third junction, the values of said resistances being so chosen that only said first conducting means is conductive at a lower end portion of said range, only said second conducting means is conductive over an upper end portion of said range, and both of said conducting means are non-conductive over the portion of said range intermediate said lower and upper end portions whereby the potential of said second junction is a function of the resistances comprising said first and second dividers when only said first conducting means is conductive, is a function of the resistances comprising said second and third dividers when only said second conducting means is conductive, and is a function of the resistances comprising said second divider when both of said conducting means are non-conductive, the voltage at said second junction being applied to said voltage sensitive capacitance.

10. In a crystal controlled oscillator, means for varying the capacitance of said crystal in accordance with the variation in resonant frequency of said crystal over a given temperature range comprising a voltage sensitive capacitance in circuit with said crystal and means for applying a unidirectional potential to said voltage sensitive capacitance which varies over said temperature range in accordance with said variation in resonant frequency of said crystal comprising a source of unidirectional potential having a common terminal and a negative terminal, a first voltage divider comprising a first resistance having a net negative temperature coefficient, said first resistance having one end connected to said negative terminal and a second resistance having a substantially zero temperature coefficient connected between said common terminal and the other end of said first resistance, a second voltage divider in shunt with said first divider, said second divider comprising third and fourth resistances having substantially zero temperature coefficients respectively, first unilateral conducting means connected between a first junction of said first and second resistances and a second junction between said third and fourth resistances, said first conducting means being poled so as to be conductive when said first junction is positive with respect to said second junction, a third voltage divider comprising a fifth resistance having a net negative temperature coefficient, one end of said fifth resistance being connected to said negative terminal and a sixth resistance connected between said common terminal and the other end of said fifth resistance, second unilateral conducting means connected between said second junction and a third junction of said fifth and sixth resistances, said second conducting means being poled so as to be conductive when said second junction is positive with respect to said third junction, the values of said resistances being chosen so that said first conducting means is conductive over a lower end portion of said range, said second conducting means is conductive over an upper end portion of said range and both of said conducting means are non-conductive in the portion of said range intermediate said lower and upper end portions whereby the voltage at said second junction is a function of the resistances comprising said first and second dividers in said lower end portion, the voltage at said second junction is a function of the resistances comprising said second and third dividers in said upper end portion, and the voltage at said second junction is a function of the resistances comprising said second divider in said intermediate portion, the voltage at said second junction being applied to said voltage sensitive capacitance.

11. In a crystal controlled transistor oscillator wherein said transistor comprises an emitter, base, and collector electrodes and wherein the frequency of the output of said oscillator varies inversely with the emitter current and wherein said crystal varies in resonant frequency over a given temperature range, means for compensating for said variation by varying the input and output impedances of said transistor thereby affecting the resonant frequency of said crystal comprising a source of unidirectional potential, a first terminal of said source being connected to said collector, the other terminal of said source being connected to said emitter, a voltage divider connected across said source, said divider comprising a plurality of resistances, at least one of said resistances having a net temperature coefficient other than zero, a junction point in said divider being connected to said base whereby the voltage between said other terminal and said base varies in accordance with temperature variation over said range.

12. An oscillator as defined in claim 11 wherein a resistance having a net negative temperature coefficient is connected between said first terminal and said base and resistance having a zero temperature coefficient is connected between said base and said other terminal.

References Cited in the file of this patent

UNITED STATES PATENTS

| | | |
|---|---|---|
| 2,111,086 | Basim | Mar. 15, 1938 |
| 2,158,844 | Andrews | May 16, 1939 |
| 2,611,873 | Gager et al. | Sept. 23, 1952 |
| 2,770,731 | Bopp et al. | Nov. 13, 1956 |
| 2,811,647 | Nilssen | Oct. 29, 1957 |
| 2,831,114 | Overbeek | Apr. 15, 1958 |